US010573530B2

(12) United States Patent
Yaegashi

(10) Patent No.: US 10,573,530 B2
(45) Date of Patent: Feb. 25, 2020

(54) PATTERN FORMING METHOD

(71) Applicant: Tokyo Electron Limited, Tokyo (JP)

(72) Inventor: Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 270 days.

(21) Appl. No.: 15/430,640

(22) Filed: Feb. 13, 2017

(65) Prior Publication Data
US 2017/0236720 A1 Aug. 17, 2017

(30) Foreign Application Priority Data

Feb. 17, 2016 (JP) .................................. 2016-027600

(51) Int. Cl.
H01L 21/311 (2006.01)
H01L 21/027 (2006.01)
H01L 21/3105 (2006.01)
H01L 21/02 (2006.01)

(52) U.S. Cl.
CPC .... H01L 21/31144 (2013.01); H01L 21/0271 (2013.01); H01L 21/0274 (2013.01); H01L 21/02123 (2013.01); H01L 21/31053 (2013.01); H01L 21/31058 (2013.01); H01L 21/31138 (2013.01)

(58) Field of Classification Search
CPC .......... H01L 21/02123; H01L 21/0274; H01L 21/31053; H01L 21/31138; H01L 21/31144; H01L 21/0271; H01L 21/31058
See application file for complete search history.

(56) References Cited

U.S. PATENT DOCUMENTS

| 7,851,363 | B2* | 12/2010 | Takeishi | G03F 7/11 |
| | | | | 438/694 |
| 8,513,134 | B2* | 8/2013 | Omura | H01L 21/0273 |
| | | | | 257/E21.143 |
| 8,569,178 | B2* | 10/2013 | Hosoya | G03F 7/40 |
| | | | | 216/41 |
| 9,650,493 | B2* | 5/2017 | Aoyagi | C09B 47/0671 |
| 9,740,100 | B2* | 8/2017 | Hasegawa | G03F 7/038 |
| 9,746,771 | B2* | 8/2017 | Kamochi | G03F 7/11 |
| 9,869,933 | B2* | 1/2018 | Rowell | G03F 7/425 |
| 9,929,012 | B1* | 3/2018 | Belyansky | G03F 7/00 |
| 10,211,050 | B2* | 2/2019 | Yaegashi | H01L 21/0273 |
| 10,366,888 | B2* | 7/2019 | Yamada | H01L 21/3088 |
| 2005/0130068 | A1* | 6/2005 | Kondoh | G03F 7/40 |
| | | | | 430/312 |

(Continued)

FOREIGN PATENT DOCUMENTS

JP 2011-060916 A 3/2011

*Primary Examiner* — Savitri Mulpuri
(74) *Attorney, Agent, or Firm* — Abelman, Frayne & Schwab

(57) ABSTRACT

Disclosed is a pattern forming method including: forming an acrylic resin layer on an underlayer; forming an intermediate layer on the acrylic resin layer; forming a patterned EUV resist layer on the intermediate layer; forming a pattern on the acrylic resin layer by etching the intermediate layer and the acrylic resin layer with the EUV resist layer as an etching mask; removing the EUV resist layer and the intermediate layer after the pattern is formed on the acrylic resin layer; and smoothing a surface of the acrylic resin layer after the EUV resist layer and the intermediate layer are removed.

8 Claims, 8 Drawing Sheets

(56) References Cited

U.S. PATENT DOCUMENTS

| | | | | |
|---|---|---|---|---|
| 2007/0128559 | A1* | 6/2007 | Ishibashi | G03F 7/40 430/330 |
| 2007/0269749 | A1* | 11/2007 | Schenker | G03F 7/30 430/322 |
| 2008/0241763 | A1* | 10/2008 | Stamper | H01L 21/0276 430/323 |
| 2009/0280440 | A1* | 11/2009 | Tarutani | G03F 7/0035 430/325 |
| 2011/0086843 | A1* | 4/2011 | Quattropani | C07D 417/04 514/211.09 |
| 2012/0021193 | A1* | 1/2012 | Lecolley | B41M 5/0047 428/201 |
| 2012/0031875 | A1* | 2/2012 | Hosoya | G03F 7/40 216/24 |
| 2013/0023120 | A1* | 1/2013 | Yaegashi | H01J 37/32091 438/689 |
| 2013/0171571 | A1* | 7/2013 | Dunn | G03F 7/0035 430/325 |
| 2013/0189844 | A1* | 7/2013 | Chen | G03F 7/0042 438/694 |
| 2014/0083972 | A1* | 3/2014 | Oyama | H01B 13/003 216/13 |
| 2014/0235065 | A1* | 8/2014 | Yaegashi | H01L 21/0273 438/758 |
| 2014/0263172 | A1* | 9/2014 | Xie | G03F 7/405 216/41 |
| 2014/0315135 | A1* | 10/2014 | Huli | G03F 7/2004 430/325 |
| 2015/0022748 | A1* | 1/2015 | Takeda | G02B 5/3033 349/33 |
| 2015/0022764 | A1* | 1/2015 | Takeda | G02B 5/3033 349/96 |
| 2016/0109804 | A1* | 4/2016 | Huli | G03F 7/40 430/325 |
| 2017/0184972 | A1* | 6/2017 | Yaegashi | G03F 7/30 |

* cited by examiner

PATTERN FORMING METHOD

CROSS-REFERENCE TO RELATED APPLICATIONS

This application is based on and claims priority from Japanese Patent Application No. 2016-027600 filed on Feb. 17, 2016 with the Japan Patent Office, the disclosure of which is incorporated herein in its entirety by reference.

TECHNICAL FIELD

The present disclosure relates to a pattern forming method.

BACKGROUND

With higher integration of semiconductor devices, a pattern of a wiring or a separation width required for a manufacturing process tends to be miniaturized. Such a miniaturized pattern is formed by etching an underlayer with a resist pattern as an etching mask (see, e.g., Japanese Patent Laid-Open Publication No. 2011-060916).

The resist pattern is formed, for example, by forming a resist layer on the underlayer, patterning the resist layer into a predetermined shape by a photolithography technique, and then smoothing the surface using, for example, plasma etching.

Further, as a method of smoothing the surface of the resist layer patterned into a predetermined shape, a method of cleaving the main chain of a resist material contained in the resist layer by, for example, irradiation with electron beams or vacuum ultraviolet rays instead of the plasma etching, may be used in some cases.

SUMMARY

According to an aspect, a pattern forming method of the present disclosure includes: forming an acrylic resin layer on an underlayer; forming an intermediate layer on the acrylic resin layer; forming a patterned EUV resist layer on the intermediate layer; forming a pattern on the acrylic resin layer by etching the intermediate layer and the acrylic resin layer with the EUV resist layer as an etching mask; removing the EUV resist layer and the intermediate layer after the pattern is formed on the acrylic resin layer; and smoothing a surface of the acrylic resin layer after the EUV resist layer and the intermediate layer are removed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
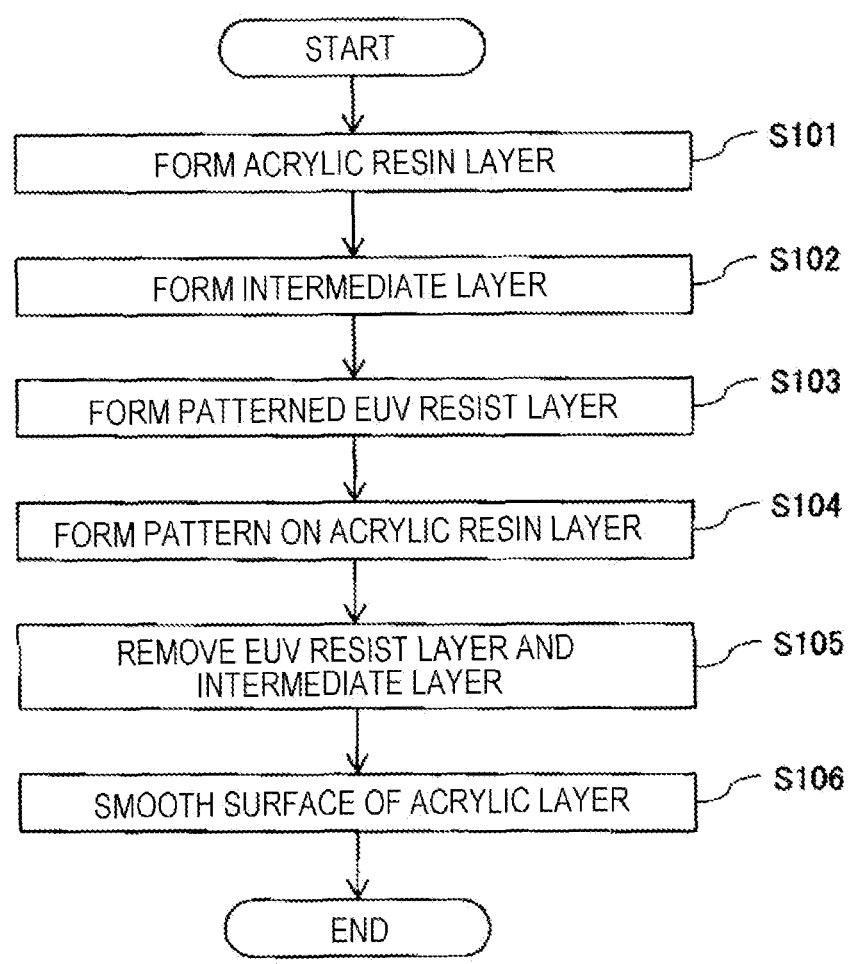
FIG. 1 is a flowchart illustrating a pattern forming method of an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a conventional method of smoothing a surface using plasma etching, when the EUV resist is used, a sufficient reduction effect on the LER value of the obtained resist pattern is not obtained.

Further, in a method of smoothing a surface by irradiation with electron beams or vacuum ultraviolet rays, when the EUV resist is used, the main chain of the EUV resist is hardly cleaved. Thus, a sufficient reduction effect on the LER value of the obtained resist pattern is not obtained.

Accordingly, in an aspect, an object of the present disclosure is to provide a pattern forming method capable of reducing the LER value of the obtained pattern.

In order to achieve the above-described object, a pattern forming method according to an aspect of the present disclosure includes: forming an acrylic resin layer on an underlayer; forming an intermediate layer on the acrylic resin layer; forming a patterned EUV resist layer on the intermediate layer; forming a pattern on the acrylic resin layer by etching the intermediate layer and the acrylic resin layer with the EUV resist layer as an etching mask; removing the EUV resist layer and the intermediate layer after the pattern is formed on the acrylic resin layer; and smoothing a surface of the acrylic resin layer after the EUV resist layer and the intermediate layer are removed.

In the above-described pattern forming method, the smoothing the surface of the acrylic resin layer includes cleaving a main chain of an acrylic resin contained in the acrylic resin layer.

In the above-described pattern forming method, the cleaving the main chain of the acrylic resin is performed by irradiating the acrylic resin layer with electron beams or ultraviolet rays.

In the above-described pattern forming method, the cleaving the main chain of the acrylic resin is performed by heating the acrylic resin layer to a predetermined temperature.

In the above-described pattern forming method, the acrylic resin layer is made of polymethyl methacrylate or an ArF resist.

In the above-described pattern forming method, the intermediate layer is made of a material that is not compatible with the acrylic resin and an EUV resist.

In the above-described pattern forming method, the intermediate layer is made of a spin-on glass or a silicon-containing anti-reflective coating.

According to the pattern forming method of the present disclosure, the LER value of the obtained pattern may be reduced.

Hereinafter, an exemplary embodiment of the present disclosure will be described with reference to the accompanying drawings. In the present specification and drawings, components having substantially the same functional configurations will be denoted by the same symbols, and the overlapping descriptions thereof will be omitted.

A pattern forming method of the exemplary embodiment is to form a fine pattern by an extreme ultraviolet (EUV) lithography technology that performs a pattern transfer with EUV, for example, a fine pattern having a dimension equal to or less than a resolution limit of an ArF lithography.

In the pattern forming method of the present embodiment, a pattern is formed (transferred) on an acrylic resin layer by etching the acrylic resin layer using a patterned EUV resist layer as an etching mask, and then the surface of the acrylic resin layer is smoothed. As a result, the LER value of the obtained pattern may be reduced.

Hereinafter, descriptions will be made on the pattern forming method of the exemplary embodiment, which is capable of reducing the LER value of the obtained pattern in a pattern formation using the EUV resist. FIG. 1 is a flowchart illustrating a pattern forming method of an exemplary embodiment of the present disclosure.

As illustrated in FIG. 1, the pattern forming method of the exemplary embodiment includes steps of forming an acrylic resin layer (step S101); forming an intermediate layer (step S102); forming a patterned EUV resist layer (step S103); forming a pattern on the acrylic resin layer (step S104); removing the EUV resist layer and the intermediate layer (step S105); and smoothing a surface of the acrylic resin layer (step S106).

Hereinafter, respective steps will be described with reference to FIGS. 2A to 7B. FIGS. 2A to 7B are views each illustrating a step of the pattern forming method of the exemplary embodiment. Among the figures, FIGS. 2A, 3A, 4A, 5A, 6A, and 7A are schematic perspective views in respective steps, and FIGS. 2B, 3B, 4B, 5B, 6B, and 7B are schematic cross-sectional views in respective steps.

Figure 2A:
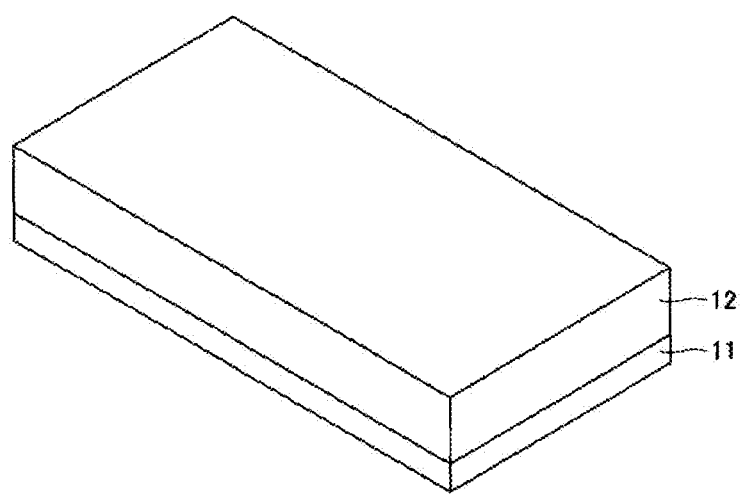
FIGS. 2A and 2B are views each illustrating a step of the pattern forming method of the exemplary embodiment of the present disclosure.
Figure 2B:
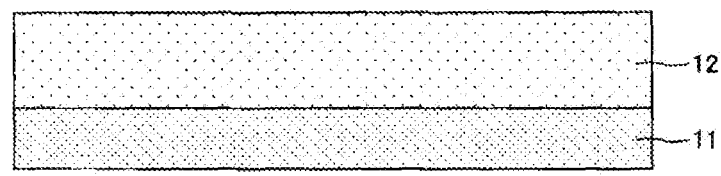

In step S101, an acrylic resin layer is formed. Specifically, as illustrated in FIGS. 2A and 2B, an acrylic resin layer 12 is formed by applying, for example, a solution containing an acrylic resin on an underlayer 11. After the solution containing the acrylic resin is applied, pre-baking may be performed to remove the solvent. Examples of the acrylic resin include polymethyl methacrylate (PMMA) and an ArF resist.

Figure 3A:
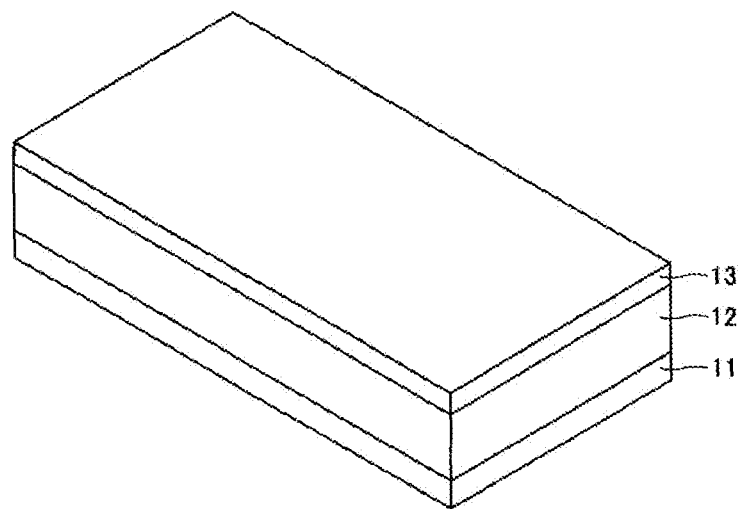
FIGS. 3A and 3B are views each illustrating a step of the pattern forming method of the exemplary embodiment of the present disclosure.
Figure 3B:
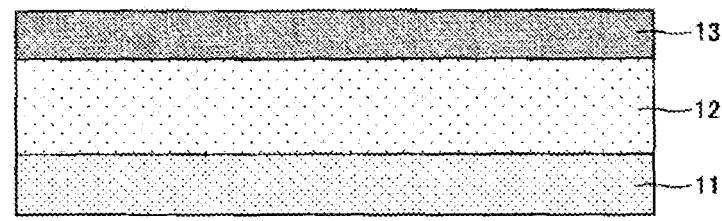

In step S102, an intermediate layer is formed. Specifically, as illustrated in FIGS. 3A and 3B, an intermediate layer 13 is formed on the acrylic resin layer 12 by, for example, spin coating. The intermediate layer 13 is not particularly limited as long as it is made of a material that is not compatible with the acrylic resin and an EUV resist. Examples of the intermediate layer 13 include a spin-on glass (SOG) and a silicon-containing anti-reflective coating (SiARC).

Figure 4A:
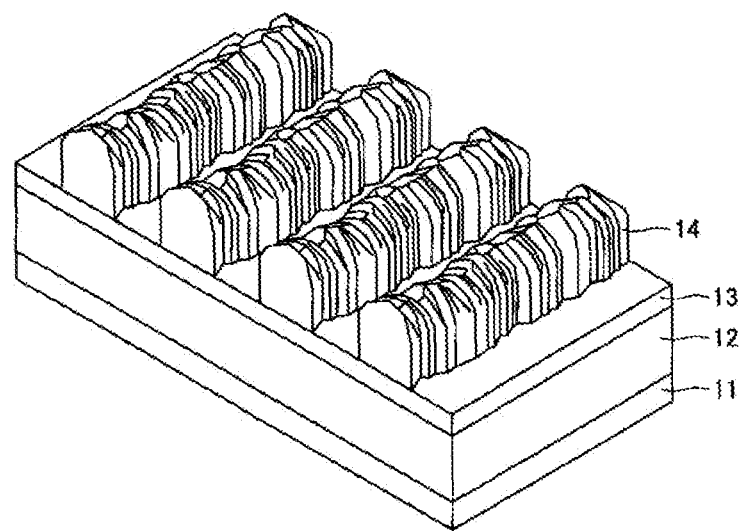
FIGS. 4A and 4B are views each illustrating a step of the pattern forming method of the exemplary embodiment of the present disclosure.
Figure 4B:
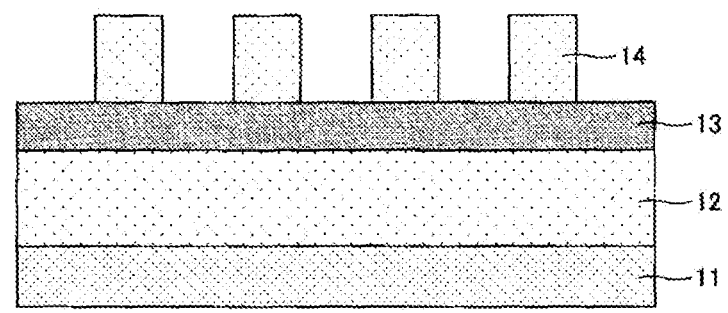

In step S103, a patterned EUV resist layer is formed. Specifically, as illustrated in FIGS. 4A and 4B, an EUV resist layer 14 is formed by applying, for example, a solution containing an EUV resist on the intermediate layer 13. Subsequently, the EUV resist layer 14 is exposed by EUV having a wavelength of 13.5 nm using a mask having a predetermined pattern as an exposure mask, developed and patterned. Thus, a patterned EUV resist layer 14 is formed. After the solution containing the EUV resist is applied, pre-baking may be performed to remove the solvent before the exposure.

Figure 5A:
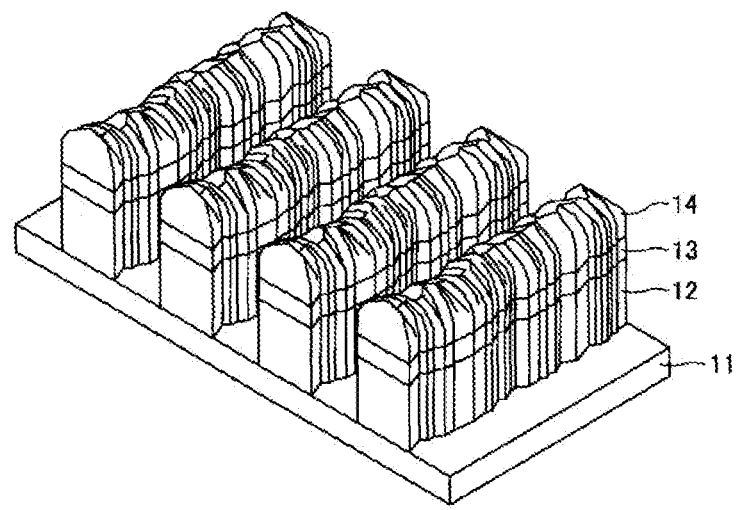
FIGS. 5A and 5B are views each illustrating a step of the pattern forming method of the exemplary embodiment of the present disclosure.
Figure 5B:
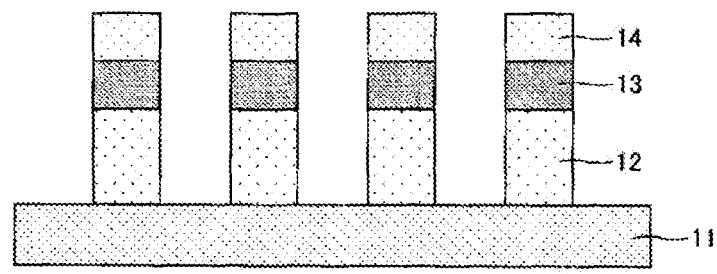

In step S104, a pattern is formed on the acrylic resin layer. Specifically, as illustrated in FIGS. 5A and 5B, the intermediate layer 13 and the acrylic resin layer 12 are etched by dry etching such as, for example, reactive ion etching (RIE) using the patterned EUV resist layer 14 as an etching mask. Thus, a pattern is formed on the acrylic resin layer 12.

Figure 6A:
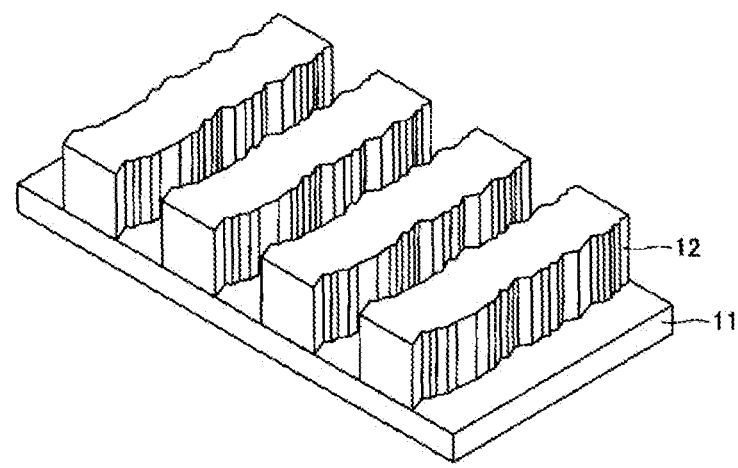
FIGS. 6A and 6B are views each illustrating a step of the pattern forming method of the exemplary embodiment of the present disclosure.
Figure 6B:
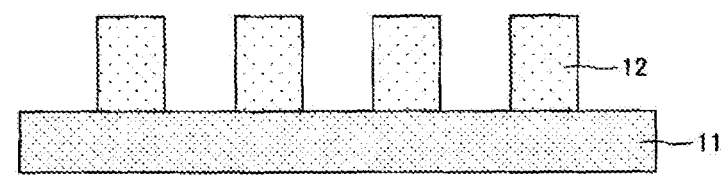

In step S105, the EUV resist layer and the intermediate layer are removed. Specifically, as illustrated in FIGS. 6A and 6B, the EUV resist layer 14 and the intermediate layer 13, which remain on the acrylic resin layer 12, are removed by, for example, immersion in a hydrofluoric acid solution.

Figure 7A:
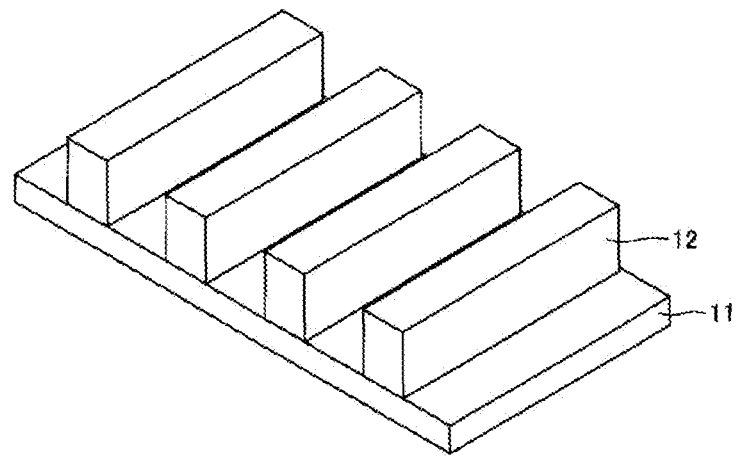
FIGS. 7A and 7B are views each illustrating a step of the pattern forming method of the exemplary embodiment of the present disclosure.
Figure 7B:
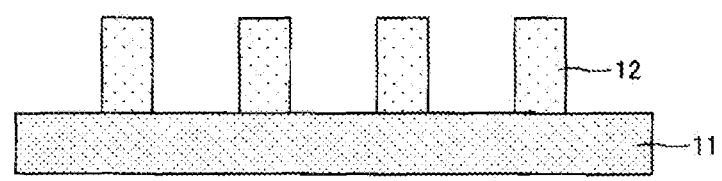

In step S106, the pattern side surface of the acrylic resin layer is smoothed. Specifically, as illustrated in FIGS. 7A and 7B, the surface of the acrylic resin layer 12 is smoothed by applying energy capable of cleaving the main chain of the acrylic resin contained in the acrylic resin layer 12, to cleave the main chain of the acrylic resin. For example, the main chain of the acrylic resin may be cleaved by irradiating the acrylic resin layer 12 with electron beams (EB). Further, the main chain of the acrylic resin may be cleaved by irradiating the acrylic resin layer 12 with vacuum ultraviolet (VUV) rays having a wavelength of 193 mm or 172 mm. Further, the main chain of the acrylic resin may be cleaved by heating the acrylic resin layer 12 to a predetermined temperature.

A desired pattern may be formed by the steps described above.

Figure 8A:
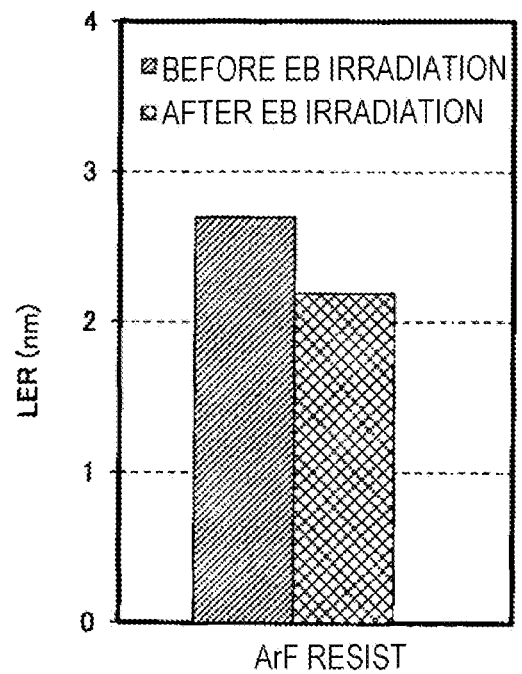
FIGS. 8A and 8B are graphs for explaining the action and effect of the pattern forming method of the exemplary embodiment of the present disclosure.
Figure 8B:
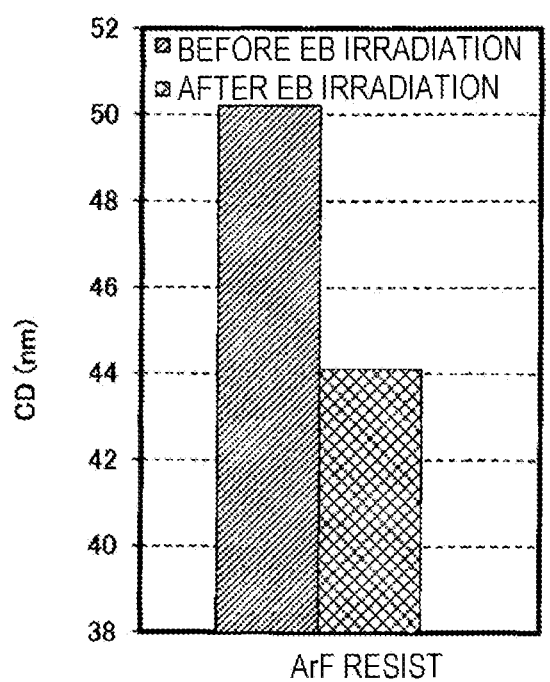

Next, the action and effect of the pattern forming method of the exemplary embodiment will be described. FIGS. 8A and 8B are graphs for explaining the action and effect of the pattern forming method of the exemplary embodiment. Specifically, FIG. 8A illustrates a line edge roughness (LER) before and after a patterned ArF resist layer is irradiated with electron beams (EB). FIG. 8B illustrates a critical dimension (CD) of the line before and after the patterned ArF resist layer is irradiated with electron beams (EB).

As illustrated in FIG. 8A, the LER value may be reduced by irradiating the patterned ArF resist layer with electron beams. In FIG. 8A, the LER value was reduced from about 2.7 nm to about 2.2 nm by irradiating the patterned ArF resist layer with electron beams. A reason for the reduction is considered that, when the patterned ArF resist layer is irradiated with electron beams, the main chain of the ArF resist contained in the ArF resist layer is cleaved, so that the ArF resist layer shrinks, thereby smoothing the surface of the ArF resist layer.

As illustrated in FIG. 8B, the CD value may be reduced by irradiating the patterned ArF resist layer with electron beams. In FIG. 8B, the CD value was reduced from about 50 nm to about 44 nm by irradiating the patterned ArF resist layer with electron beams. A reason for the reduction is considered that, when the patterned ArF resist layer is irradiated with electron beams, the main chain of the ArF resist contained in the ArF resist layer is cleaved, so that the ArF resist layer shrinks.

As described above, in the pattern forming method of the exemplary embodiment, a pattern is formed on the acrylic resin layer 12 by etching the acrylic resin layer 12 using the patterned EUV resist layer 14 as an etching mask, and then, the surface of the acrylic resin layer 12 is smoothed. As a result, the LER value of the obtained pattern may be reduced.

Further, in the pattern forming method of the exemplary embodiment, when the acrylic resin layer 12 is patterned, the top surface of the acrylic resin layer 12 is protected by the intermediate layer 13. Thus, the top surface of the acrylic resin layer 12 is not etched. Therefore, the top surface of the patterned acrylic resin layer 12 may be smoothed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A pattern forming method comprising:
   forming an acrylic resin layer on an underlayer;
   forming an intermediate layer on the acrylic resin layer;
   forming an EUV resist layer on the intermediate layer by applying a solution including an EUV resist on the intermediate layer;
   exposing the EUV resist layer to an extreme ultra violet through an exposure mask;
   forming a patterned EUV resist layer on the intermediate layer by developing and patterning an exposed portion of the EUV resist layer;
   forming a pattern on the acrylic resin layer by etching the intermediate layer and the acrylic resin layer with the patterned EUV resist layer as an etching mask;
   removing the patterned EUV resist layer and the intermediate layer after the pattern is formed on the acrylic resin layer; and
   smoothing a surface of the acrylic resin layer after the patterned EUV resist layer and the intermediate layer are removed.

2. The pattern forming method of claim 1, wherein the smoothing the surface of the acrylic resin layer includes cleaving a main chain of an acrylic resin contained in the acrylic resin layer.

3. The pattern forming method of claim 2, wherein the cleaving the main chain of the acrylic resin is performed by irradiating the acrylic resin layer with electron beams or ultraviolet rays.

4. The pattern forming method of claim 2, wherein the cleaving the main chain of the acrylic resin is performed by heating the acrylic resin layer to a predetermined temperature.

5. The pattern forming method of claim 1, wherein the acrylic resin layer is made of polymethyl methacrylate or an ArF resist.

6. The pattern forming method of claim 1, wherein the intermediate layer is made of a material that is not compatible with an acrylic resin and an EUV resist.

7. The pattern forming method of claim 6, wherein the intermediate layer is made of a spin-on glass or a silicon-containing anti-reflective coating.

8. The pattern forming method of claim 1, further comprising:
   performing pre-baking to remove a solvent after the ArF resist layer is formed.

* * * * *